US006169435B1

(12) United States Patent
Fujii et al.

(10) Patent No.: US 6,169,435 B1
(45) Date of Patent: Jan. 2, 2001

(54) SEMICONDUCTOR INTEGRATED CIRCUIT DEVICE WITH BUILT-IN TIMING REGULATOR FOR OUTPUT SIGNALS

(75) Inventors: Takaharu Fujii; Toshichika Sakai; Yasuo Yashiba, all of Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/261,742

(22) Filed: Mar. 3, 1999

(30) Foreign Application Priority Data

Mar. 3, 1998 (JP) .................................................. 10-050714

(51) Int. Cl.[7] .................................................. H03H 11/26
(52) U.S. Cl. ........................................... 327/261; 327/147
(58) Field of Search .......................... 327/141, 146–161, 327/244, 261–273, 276–279, 284, 286, 291–292

(56) References Cited

U.S. PATENT DOCUMENTS

| 5,485,114 |   | 1/1996 | Funakura et al. | ..................... | 327/262 |
| 5,486,783 | * | 1/1996 | Baumert et al. | ..................... | 327/150 |
| 5,539,344 |   | 7/1996 | Hatakenaka | ..................... | 327/147 |
| 5,712,884 | * | 1/1998 | Jeong | ..................... | 327/158 |
| 5,900,754 |   | 5/1999 | Nakatani | ..................... | 327/150 |
| 5,939,913 | * | 8/1999 | Tomita | ..................... | 327/159 |
| 5,952,857 | * | 9/1999 | Suzuki | ..................... | 327/158 |
| 5,973,525 | * | 10/1999 | Fujii | ..................... | 327/149 |

FOREIGN PATENT DOCUMENTS

| 0 662 756 | 7/1995 | (EP) . |
| 4-26243 | 1/1992 | (JP) . |
| 4-150408 | 5/1992 | (JP) . |
| 9-181580 | 7/1997 | (JP) . |

* cited by examiner

Primary Examiner—My-Trang Nuton
(74) Attorney, Agent, or Firm—Foley & Lardner

(57) ABSTRACT

A semiconductor integrated circuit device is expected to output a multi-bit output signal at an extremely narrow timing in response to a system clock, wherein the semiconductor integrated circuit device includes synchronous latch circuits, a first phase-locked loop responsive to the system clock for producing a dummy data signal and a high-frequency intermediate clock signal, a delay circuit for producing a delayed clock signal delayed from the system clock by a predetermined number of clock pulses of the high-frequency intermediate clock signal and a second phase-locked loop comparing a dummy output signal with the delayed clock signal for producing a synchronous clock signal at appropriate timing, and the synchronous latch circuits is responsive to the synchronous clock signal for latching data signals and the dummy data signal, thereby outputting the output signals and the dummy output signal within the narrow timing.

18 Claims, 4 Drawing Sheets

SEMICONDUCTOR INTEGRATED CIRCUIT DEVICE WITH BUILT-IN TIMING REGULATOR FOR OUTPUT SIGNALS

FIELD OF THE INVENTION

This invention relates to a semiconductor integrated circuit device and, more particularly, to a semiconductor integrated circuit device with a built-in timing regulator for output signals.

DESCRIPTION OF THE RELATED ART

A microprocessor is an essential component of a data processing system, and communicates with other system components in synchronism with a system clock. The system clock is getting faster and faster. A microprocessor is synchronous with the system clock at 100 MHz to 300 MKHz. In this instance, the pulse period is only 3 nanoseconds to 10 nanoseconds. The system components are expected to respond to the high-speed system clock.

Logic gates are important circuit components of the system components, and electric signals are propagated through the logic gates. However, the signal propagation speed is not constant between the products, because the manufacturer can not strictly adjust the dimensions of the component transistor and the transistor characteristics such as a current driving capability to respective target value. Moreover, the amount of load to be driven, the environment temperature and a power voltage are not constant. If the difference of signal propagation speed to an output circuit is serious, another system component fails to communicate with the system component. The difference in signal propagation speed may result in a binary value different from the logic operation.

The high-speed system clock merely offers a narrow timing to the system components, and the manufacturer is forced to design the system components to place a multi-bit digital output signal at the output pins within the narrow timing. In other words, the manufacturer designs the system component to satisfy the minimum delay time and the maximum delay time with respect to the system clock. If a system component places the multi-bit digital output signal at the output pins earlier than the narrow timing, another system component fetches the next output signal. On the other hand, if a system component delays the output signal, another system component twice fetches the previous output signal.

As the circuit components of the system are scaled down, the design rules become more sever. If a process parameter fluctuates during the fabrication of the system component on a semiconductor wafer, the circuit components are seriously affected by the process parameter, and the electric properties are liable to be deviated from the target properties.

In order to guarantee the products, the manufacturer checks the product to see whether or not the signal delay falls within the range between the minimum delay time and the maximum delay time before delivery to customers. If a product does not satisfy the design specification, the manufacturer rejects the product as defective. Such a defective product increases the production cost, and is undesirable for the manufacturer. However, the design specification for the output characteristics is getting sever more and more due to the high-speed system clock. The manufacturer feels that the design specification for the output characteristics are not easy to realize.

In fact, the manufacturer thinks that the output characteristics to be required are hardly achieved through improvements of the process. If a fabrication process unavoidably introduces a dispersion of the order of 10 nanoseconds into the output characteristics of a semiconductor integrated circuit device. This dispersion is ignoreable when the system clock is under 10 MHz, because the system clock offers 100 nanoseconds to the semiconductor device. However, if the system clock is increased to 100 MHz, the dispersion is as much as the pulse period of the system clock, i.e., 10 nanoseconds, and the manufacturer can not use the fabrication process for the semiconductor integrated circuit device.

Japanese Patent Publication of Unexamined Application No. 9-181580 proposes to control the delay time by using a variable delay circuit. The variable delay circuit includes a series of delay units, and the delay units are respectively accompanied with AND gates. A control signal is selectively supplied to the AND gates, and causes the selected AND gates to transfer an electric signal to the next delay unit.

The prior art variable delay circuit is regulated to a target delay time before installation on a circuit board for an electronic system. First, an operator connects a tester (not shown) to the output nodes of the delay units, and measures a delay time at each output node. The operator selects one of the output nodes appropriate to the delay time to be required, and the delay units after the selected one are deactivated in order not to propagate the signal.

Even if the transistor characteristics fluctuate due to the fluctuation of process parameter, the fluctuation merely forces the manufacturer to change the appropriate output node from one delay unit to another, and the manufacturer can adjust the prior art delay circuit to the target delay time at all times. However, a problem is encountered in the prior art semiconductor integrated circuit disclosed in the Japanese Patent Publication of Unexamined Application in the production cost.

The tester is expected to exactly measure the delay time. As described hereinbefore, the system clock defines an extremely short pulse period. For this reason, the regulating work requires a highly accurate tester. Such a highly accurate tester is very expensive. Moreover, only a particular kind of tester is available for the prior art delay circuit. Other kinds of tester can not connect the probes to the prior art delay circuit. The manufacturer needs to prepare the particular kind of tester. The expensive tester pushes up the production cost.

Another factor of the high production cost is complexity of the regulation work. The regulation work consumes a large amount of time and labor, and increases the production cost.

Yet another factor of the high production cost is a low production yield due to the severe regulation work. The manufacturer measures the delay time before the installation on the circuit board in order to regulate the delay time to the target value. However, the regulation work is usually carried out in a testing environment different from the actual environment on the circuit board. The different environment such as the temperature affects the transistor characteristics. If the difference between the testing environment and the actual environment is a little, the prior art delay circuit introduces an actual delay time approximately equal to the delay time in the regulation work. However, if the difference is not ignoreable, the prior art delay circuit is causative of malfunction of the electronic system. This means that a margin is required. For this reason, the manufacturer uses a severe specification for the prior art delay circuit. The severer the specification, the lower the production yield. The low production yield results in the high production cost.

SUMMARY OF THE INVENTION

It is therefore an important object of the present invention to provide a semiconductor integrated circuit device, a delay circuit of which is regulated to a target delay time without an expensive tester in an environment identical with an actual environment on a circuit board for an electric system.

To accomplish the object, the present invention proposes to internally generate an output timing delayed from a system clock by a predetermined delay time.

In accordance with one aspect of the present invention, there is provided a semiconductor integrated circuit device comprising a timing regulator for offering an output timing to output signals, and the timing regulator includes a delayed signal generator supplied with a reference clock signal and producing a delayed clock signal delayed from the reference clock signal by a predetermined time and an output timing generator connected to the delayed signal generator and compensating a time lag between the delayed clock signal and the output signals for outputting the output signals at the output timing.

BRIEF DESCRIPTION OF THE DRAWINGS

The features and advantages of the semiconductor integrated circuit device will be more clearly understood from the following description taken in conjunction with the accompanying drawings in which.

DESCRIPTION OF THE PREFERRED EMBODIMENTS

First Embodiment

Figure 1:
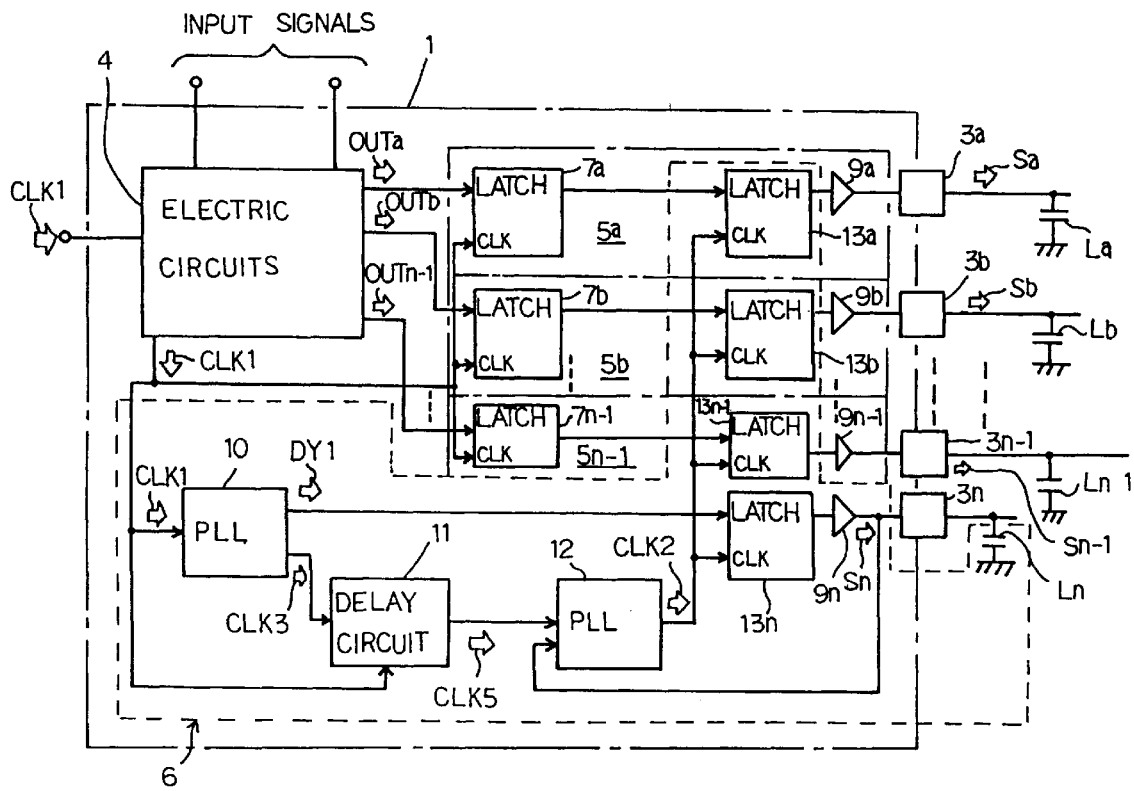
FIG. 1 is a block diagram showing the circuit configuration of a semiconductor integrated circuit device according to the present invention.

Referring to FIG. 1 of the drawings, a semiconductor integrated circuit device is fabricated on a semiconductor chip 1. The semiconductor integrated circuit device includes an integrated circuit 2 and signal pads 3a/ 3b/ . . . / 3n. The integrated circuit 1 largely comprises electric circuits 4, plural output circuits 5a/ 5b/ . . . / 5n-1 connected to the electric circuits 4 and a timing regulator 6. The electronic circuits 4 are responsive to input signals for producing output data signals OUTa, OUTb, . . . OUTn-1. The output data signals OUTa/ OUTb/ . . . / OUTn-1 are respectively supplied to the output circuits 5a/ 5b/ . . . / 5n-1, and the output circuits 5a/ 5b/ . . . / 5n-1 produce output signals Sa/ Sb/ . . . / Sn-1 at the signal pads 3a/ 3b/ . . . / 3n-1 at appropriate output timings. The output circuit 5a/ 5b/ . . . / 5n-1 includes a data latch circuit 7a/ 7b . . . / 7n-1 and an output buffer 9a/ 9b . . . / 9n-1. The data latch circuit 7a/ 7b/ . . . / 7n-1 has an input node connected to the electric circuits 4, a clock node CLK supplied with a system clock CLK1 and an output node connected to the timing regulator 6. The data latch circuit 7a/ 7b/ . . . /7n-1 is responsive to the system clock CLK1 so as to latch the output data signal OUTa/ OUTb/ . . . / OUTn-1. The data latch circuit 7a/ 7b/ . . . /7n-1 puts the output data signal OUTa/ OUTb/ . . . / OUTn-1 at the output node thereof. The output data signal OUTa/ OUTb/ . . . / OUTn-1 is supplied through the timing regulator 6 to the data buffer 9a/ 9b/ . . . / 9n-1, and the data buffer 9a/ 9b/ . . . /9n-1 drives a capacitive load La/ Lb/ . . . / Ln-1 coupled to the signal pads 3a/ 3b/ . . . / 3n-1 with the output signal Sa/ Sb/ . . . / Sn-1.

The timing regulator 6 includes a phase-locked loop 10, a delay circuit 11, a phase-locked loop 12, plural synchronous latch circuits 13a/ 13b/ . . . / 13n-1/ 13n, a data buffer 9n and a dummy capacitive load Ln. The data buffer 9n are similar in circuit configuration to the data buffers 9a to 9n-1, respectively. The data buffer 9n is connected to the signal pad 3n, and the dummy capacitive load Ln is connectable to the signal pad 3n. The dummy capacitive pad Ln may be regulated to the magnitude of the capacitive load La/ Lb/ . . . / Ln-1.

The synchronous latch circuits 13a/ 13b/ . . . / 13n are similar in circuit configuration to one another, and are associated with the data latch circuits 7a/ 7b/ . . . / 7n-1, respectively. The synchronous latch circuits 13a to 13n-1 are connected between the data latch circuits 7a to 7n-1 and the data buffers 9a to 9n-1, respectively. The synchronous latch circuit 13a/ 13b/ . . . / 13n-1 has an input node connected to the output node of the data latch circuit 7a/ 7b/ . . ./ 7n-1, and a clock node CLK supplied with an internal synchronous clock signal CLK2 and an output node connected to the input node of the data buffer 9a/ 9b/ . . . / 9n-1. The synchronous latch circuit 13a/ 13b/ . . . / 13n-1 and the synchronous latch circuit 13n are responsive to the internal synchronous clock signal CLK2 so as to simultaneously latch the output data signals OUTa/ OUTb/ . . . / OUTn-1 and a dummy data signal DY1. The synchronous latch circuits 13a to 13n-1 respectively put the output data signals OUTa to OUTn-1 at the output nodes thereof, and supply them to the data buffers 9a to 9n-1, respectively. The synchronous latch circuit 13n puts the dummy data signal DY1 at the output node thereof concurrently with the other synchronous latch circuits 13a-13n-1, and the data buffer 9n produces a dummy output signal Sn from the dummy data signal DY1, and supplies the dummy output signal Sn to the signal pad 3n.

Figure 2:
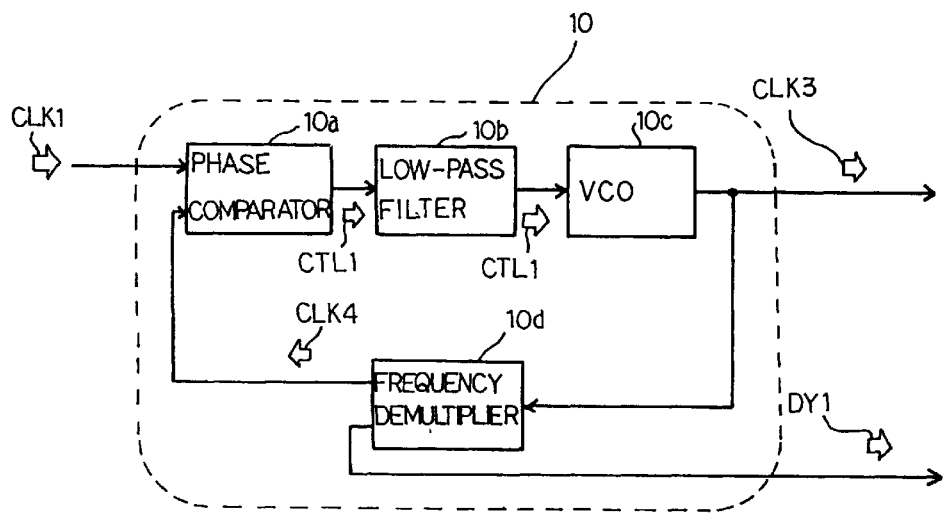
FIG. 2 is a block diagram showing the circuit configuration of a phase-locked loop incorporated in a timing regulator forming a part of the semiconductor integrated circuit device.

The phase-locked loop 10 is detailed in FIG. 2. The phase-locked loop 10 includes a phase comparator 10a, a low-pass filter 10b, a voltage-controlled oscillator 10c and a frequency demultiplier 10d. The voltage-controlled oscillator 10c is abbreviated as "VCO" in FIG. 2. The phase comparator 10a, the low-pass filter 10b, the voltage controlled oscillator 10c and the frequency demultiplier 10d form a loop, and the dummy data signal DY1 and an internal clock signal CLK3 are taken out from the frequency demultiplier 10d and the voltage-controlled oscillator 10c, respectively.

The phase comparator 10a has two input nodes, and the clock signal CLK1 and an intermediate clock signal CLK4 are supplied to the input nodes of the phase comparator 10a, respectively. The phase comparator 10a compares the intermediate clock signal CLK4 with the system clock signal CLK1 to see whether the intermediate clock signal CLK4 is synchronous with the system clock CLK1 or not. If the intermediate clock signal CLK4 is delayed or advanced with respect to the system clock CLK1, the phase comparator 10a produces a control voltage signal CTL1 representative of increase or decrease of the oscillation of the voltage-controlled oscillator 10c. The control voltage signal CTL1 passes through the low-pass filter 10b, and the low-pas filter 10b eliminates high-frequency noise from the control voltage signal CTL1. The low-pass filter 10b supplies the control voltage signal CTL1 to the control node of the voltage-controlled oscillator 10c, and voltage-controlled oscillator 10c regulates the intermediate clock signal CLK3 to a frequency corresponding to the magnitude of the control voltage signal CTL1. When the frequency-divided signal CLK4 is synchronous with the system clock CLK1, the intermediate clock signal CLK3 is M times greater in frequency than the system clock CLK1. In this instance, "M" is eight, and the intermediate clock signal CLK3 is eight times greater in frequency than the system clock signal CLK1. The intermediate clock signal CLK3 is supplied to the input node of the delay circuit 11 and the input node of the frequency demultiplier 10d.

The frequency demultiplier 10d produces the intermediate clock signal CLK4 and the dummy data signal DY1 at different frequencies. The frequency of the intermediate clock signal CLK4 is 1/M of the frequency of the intermediate clock signal CLK3, and the frequency demultiplier 10d supplies the intermediate clock signal CLK4 to the phase comparator 10a. On the other hand, the dummy data signal DY1 is twice longer in pulse period than the intermediate clock signal CLK4, and is supplied to the input node of the synchronous latch circuit 13n.

Figure 3:
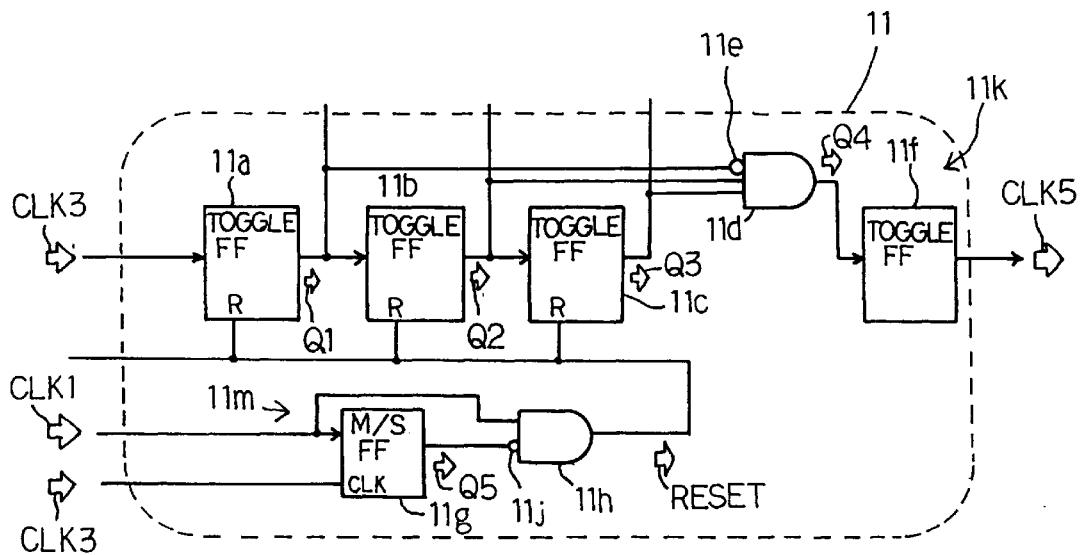
FIG. 3 is a block diagram showing the circuit configuration of a delay circuit incorporated in the timing regulator.

FIG. 3 illustrates the circuit configuration of the delay circuit 11. The delay circuit 11 includes plural toggle flip-flop circuits 11a/ 11b/ 11c connected in series, an AND gate 11d having three input nodes directly and indirectly connected to the output nodes of the toggle flip-flop circuits 11a/ 11b/ 11c, an inverter 11e connected to one of the input nodes of the AND gate 11d, a toggle flip-flop circuit 11f connected to the output node of the AND gate 11e. The intermediate clock signal CLK3 is supplied to the input node of the toggle flip-flop circuit 11a, and the toggle flip-flop circuit 11a changes an output signal Q1 between a high level and a low level in response to the intermediate clock signal CLK3. The output signal Q1 is supplied to the input node of the next toggle flip-flop circuit 11b, and the toggle flip-flop circuit 11b changes an output signal Q2 between the low level and the high level in response to the output signal Q1. The output signal Q2 is supplied to the input node of the next toggle flip-flop circuit 11c, and the toggle flip-flop circuit 11c changes an output signal Q3 between the high level and the low level in response to the output signal Q2. The output signal Q1 is supplied to the inverter 11e, and the inverter 11e supplies the inverted signal of the output signal Q1 to the input node of the AND gate 11d. The other output signals Q2/ Q3 are supplied to the other input nodes of the AND gate 11d, respectively, and the inverted signal of the output signal Q1 is ANDed with the output signals Q2/ Q3. When the inverted signal of the output signal Q1 and the other output signals Q2/ Q3 are in the high level, the AND gate 11d changes an output signal Q4 to the high level, and supplies the output signal Q4 to the input node of the toggle flip-flop circuit 11f. The toggle flip-flop circuit 11f changes an intermediate delayed clock signal CLK5 between the high level and the low level in response to the output signal Q4.

The delay circuit 11 further includes a master-slave flip-flop circuit 11g, an AND gate 11h and an inverter 11j. The system clock signal CLK1 is supplied to the input node of the master-slave flip-flop circuit 11g, and the intermediate clock signal CLK3 is supplied to the clock node CLK of the master-slave flip-flop circuit 11g. The system clock signal CLK1 is further supplied to one of the input nodes of the AND gate 11h, and the master-slave flip-flop circuit 11g supplies an output signal Q5 through the inverter 11j to the other input node of the AND gate 11h. The system clock signal CLK1 is ANDed with the inverted signal of the output signal Q5, and the AND gate 11h produces a reset signal RESET. The reset signal RESET is supplied to the reset nodes of the toggle flip-flop circuits 11a/ 11b/ 11c. The reset signal RESET rises at a pulse rise of the system clock CLK1, and falls at the next pulse decay of the intermediate clock signal CLK3.

The reset signal RESET causes the toggle flip-flop circuits 11a/ 11b/ 11c to change the output signals Q1/ Q2/ Q3 to the low level, and the toggle flip-flop circuits 11a/ 11b/ 11c change the bit pattern of the output signals Q1/ Q2/ Q3 in response to the intermediate clock signal CLK3. The AND gate 11e raises the output signal Q4 to the high level at the pulse rise of the N-th clock pulse of the intermediate clock signal CLK3 after the pulse rise of the system clock CLK1. In this instance, "N" is two, and the toggle flip-flop circuit 11f changes the intermediate clock signal 11f between the high level and the low level at the second pulse rise after the pulse rise of the system clock CLK1. Thus, the toggle flip-flop circuits 11a/ 11b/ 11c, the inverter 11e, the AND gate 11d and the toggle flip-flop circuit 11f form in combination a counter 11k, and the master-slave flip-flop circuit 11g, the inverter 11j and the AND gate 11h as a whole constitute a reset signal generator 11m.

Figure 4:
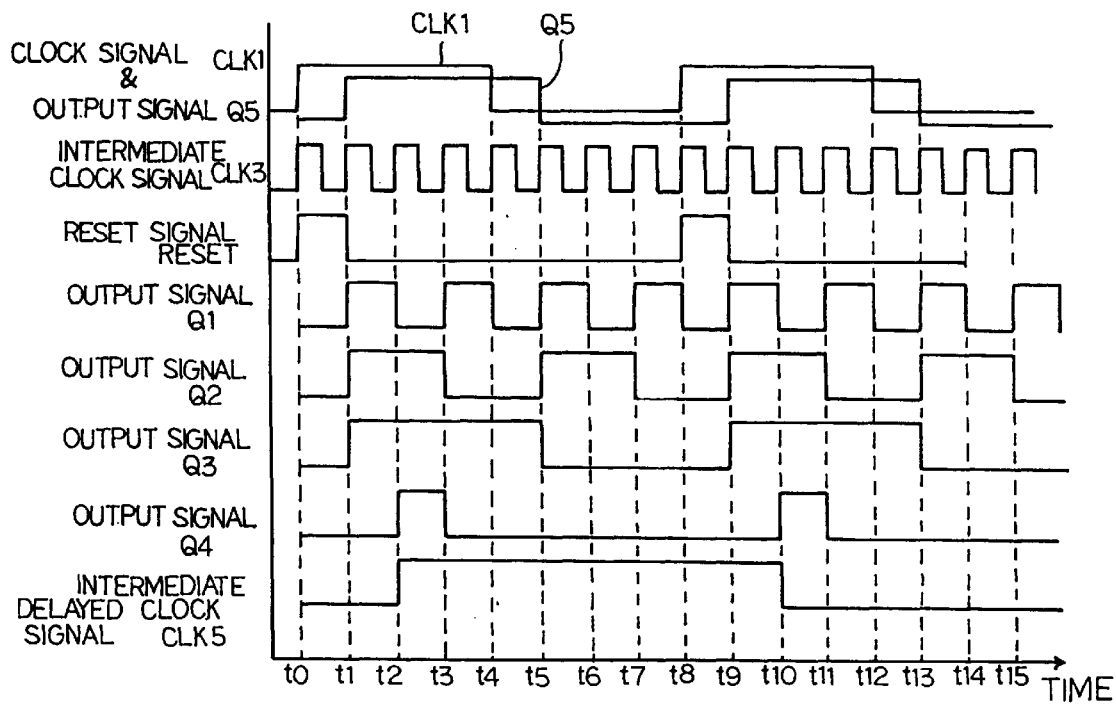
FIG. 4 is a timing chart showing the circuit behavior of the phase-locked loop and the delay circuit.

The phase-clocked loop 10 and the delay circuit 11 behave as shown in FIG. 4. The system clock CLK1 rises at time t0 and time t8. The voltage-controlled oscillator 10c generates the intermediate clock signal CLK3 eight times greater in frequency than the system clock signal CLK1. The AND gate 11h raises the reset signal RESET concurrently with the pulse rise of the system clock CLK1, and the intermediate clock signal CLK3 causes the masterslave flip-flop circuit 11g to change the output signal Q5 to the high level at the pulse rise of the intermediate clock signal CLK3 at time tl and time t9. The inverter 11j changes the inverted signal of the output signal Q5 to the low level at time t1 and time t9. For this reason, the reset signal RESET rises at time t0 and time t8, and falls at time t1 and time t9. When the reset signal RESET rises to the high level, all the toggle flip-flop circuits 11a/ 11b/ 11c change the output signals Q1/ Q2/ Q3 to the high level.

The toggle flip-flop circuit 11a rises the output signal Q1 at every third pulse rise of the intermediate clock signal CLK3, i.e., at time t1, time t3, time t5, time t7, time t9, time t11, time t13 and time t15. The toggle flip-flop circuit 11b rises the output signal Q2 at every third pulse rise of the output signal Q1, i.e., at time t1, time t5, time t9 and time t13, and the toggle flip-flop circuit 11c rises the output signal Q3 at every third pulse rise of the output signal Q2, i.e., at time t1 and time t9. The output signals Q1/ Q2/ Q3 stepwise decrease the binary value thereof from (111) through (011), (010) to (000).

The inverted signal of the output signal Q1 and the output signals Q2/ Q3 are in the high level between time t2 and time t3 and between time t10 and time t11, and the AND gate changes the output signal Q4 to the high level at time t2 and time t10. The toggle flip-flop circuit 11f raises the intermediate delayed clock signal CLK5 to the high level at time t2, and recovers it at time t10. Thus, the delay circuit 11 introduces the time delay equal to (pulse period of the system clock CLK1÷M×N) between the pulse rise of the system clock CLK1 and the pulse rise/ pulse decay of the intermediate clock signal CLK3. In order to raise the output signal Q4 once in the time period between two pulse rises of the reset signal, the counter is to be designed to count at least 2 M under the condition that the intermediate clock signal CLK3 is M times greater in frequency than the system clock CLK1. Thus, the delay circuit 11 changes the intermediate delayed clock signal CLK5 between the high level and the low level at the timings each delayed from the pulse rise of the system clock CLK1 by the predetermined time. The predetermined time is not dependent on the transistor characteristics affectable by the fabrication process, because, the predetermined time is equal to an integral multiple of the pulse period of the intermediate clock signal CLK3.

Figure 5:
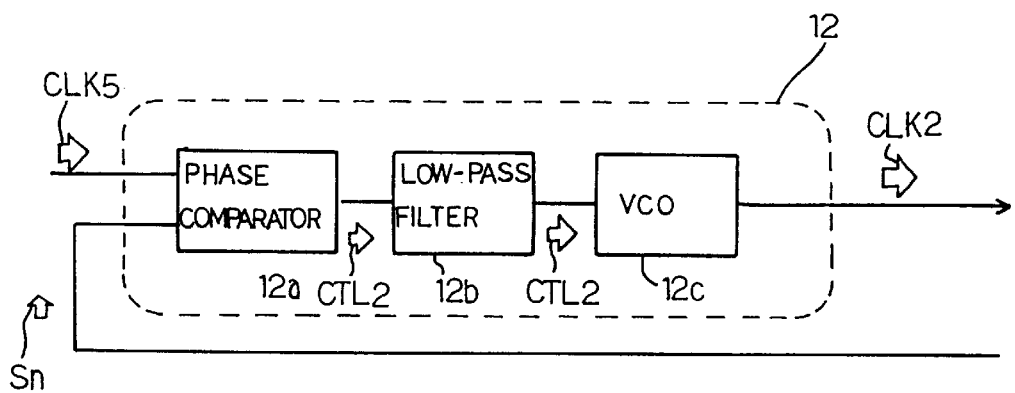
FIG. 5 is a block diagram showing the circuit configuration of another phase-locked loop incorporated in the timing regulator.

FIG. 5 illustrates the circuit configuration of the phase-locked loop 12. The phase-locked loop 12 includes a phase comparator 12a, a low-pass filter 12b connected to the phase comparator 12a and a voltage-controlled oscillator 12c connected to the low-pass filter 12b. The intermediate delayed clock signal CLK5 and the dummy output signal Sn are supplied to the phase comparator 12a, and the phase comparator 12a produces a control voltage signal CTL2 representative of a difference in phase between the intermediate delayed clock signal CLK5 and the dummy output signal Sn. The low-pass filter 12b eliminates high-frequency noise from the control voltage signal CTL2, and supplies it to the voltage-controlled oscillator 12c. The voltage-controlled oscillator 12c generates the synchronous clock signal CLK2 depending upon the magnitude of the control voltage signal CTL2. When the phase difference between the dummy output signal Sn and the intermediate delayed clock signal CLK5 is zero, the synchronous clock signal CLK2 is twice greater in frequency than the intermediate delayed clock signal CLK5. The synchronous clock signal CLK2 is supplied to the clock nodes of the synchronous latch circuits 13a to 13n.

The synchronous latch circuits 13a to 13n take the output data signals OUTa–OUTn-1 and the dummy data signal DY1 in response to the synchronous clock signal CLK2, and the phase-locked loop 12 controls the phase of the synchronous clock signal CLK2 with respect to the intermediate delayed clock signal CLK5, which is delayed from the system clock signal CLK1 by the predetermined time. For this reason, the phase-locked loop 12 offers the latch timing delayed from the system clock signal CLK1 by the predetermined time to the synchronous latch circuits 13a to 13n.

Figure 6:
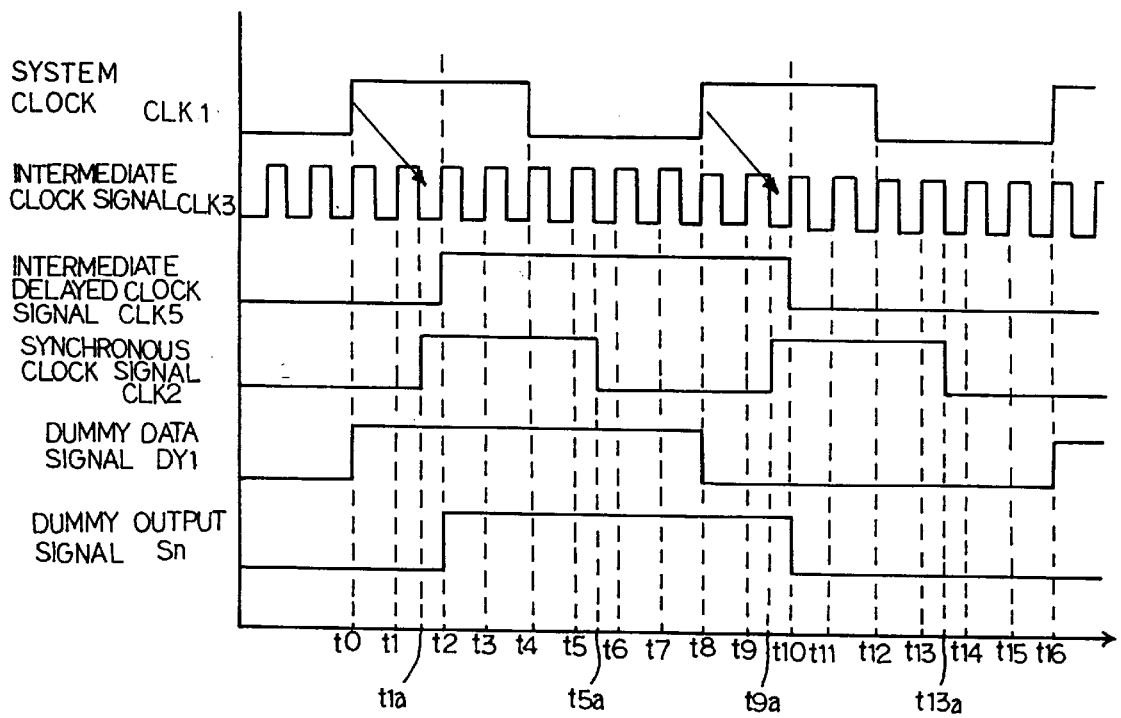
FIG. 6 is a timing chart showing the circuit behavior of the timing regulator.

FIG. 6 illustrates the circuit behavior of the timing regulator 6. Although description is focused on only the latch timing for the dummy data signal DY1, the synchronous clock signal CLK2 is further supplied to the other synchronous latch circuits 13a to 13n-1, and the output data signals OUTa–OUTn-1 are concurrently latched by the synchronous latch circuits 13a to 13n-1, respectively.

The relation between the system clock CLK1, the intermediate clock signal CLK3 and the intermediate delayed clock signal CLK5 has been already described. Namely, the intermediate clock signal CLK3 is eight times greater in frequency than the system clock CLK1, and the intermediate delayed clock signal CLK5 has leading/ trailing edges each delayed from the leading edge of the system clock CLK1 by the predetermined time twice longer than the pulse period of the intermediate clock signal CLK3. The dummy data signal DY1 has the pulse period twice longer than the pulse period of the system clock CLK1.

The intermediate clock signal CLK3 and the dummy data signal DY1 rise at time t0 together with the system clock signal CLK1. The dummy data signal DY1 is supplied to the input node of the synchronous latch circuit 13n, and keeps the input node of the synchronous latch circuit 13n in the high level until time t8.

The phase-locked loop 12 raises the synchronous clock signal CLK2 to the high level at time t1a, and supplies the high level to the clock node of the synchronous latch circuit 13n. The dummy data signal DY1 is latched by the synchronous latch circuit 13n, and the synchronous latch circuit 13n changes the output node thereof to the high level, and the data driver 9n changes the dummy output signal Sn to the high level at time t2. Although a delay time is introduced between the data latching of the synchronous latch circuit 13n and the output of the dummy output signal Sn due to the capacitive load Ln, the phase-locked loop 12 controls the synchronous clock signal CLK2 so as to align the leading edge of the dummy output signal Sn with the leading edge of the intermediate delayed clock signal CLK5. In other words, the phase-locked loop 12 changes the synchronous clock signal CLK2 to the high level earlier than the pulse rise of the intermediate delayed clock signal CLK5. The system clock CLK1 rises to the high level at time t8 again, and the frequency demodulator 10d changes the dummy data signal DY1 to the low level. The dummy data signal DY1 changes the potential level at the input node of the synchronous latch circuit 13n to the low level. The phase-locked loop 12 raises the synchronous clock signal CLK2 to the high level at time t9a, and the low level is taken into the synchronous latch circuit 13n. The synchronous latch circuit 13n immediately changes the output node to the low level, and the data buffer 9n changes the dummy output signal Sn to the low level at time t10. The phase-locked loop 12 controls the synchronous clock signal CLK2 so as to align the trailing edge of the dummy output signal Sn with the trailing edge of the intermediate delayed clock signal CLK5 as shown, and the timing regulator 6 repeats the regulating operation between time t0 to time t15. Thus, the dummy output signal Sn is delayed from the system clock CLK1 by the predetermined delay time at all times, and the timing regulator 6 is free from fluctuations during the fabrication process. As described hereinbefore, the synchronous clock signal CLK2 is supplied to not only the clock node of the synchronous latch circuit 13n but also the clock nodes of the synchronous latch circuits 13a to 13n-1. Even if the latch circuits 7a to 7n-1 put the output data signals OUTa to OUTn-1 at the output nodes thereof at different timings around the potential change of the dummy data signal DY1, the synchronous latch circuits 13a to 13n-1 concurrently latch the output data signals OUTa to OUTn-1 in response to the synchronous clock signal CLK2, and the data buffers 9a to 9n-1 change the output signals Sa to Sn-1 at the output timing delayed from the system clock CLK1 by the predetermined delay time.

The dummy data signal DY1 is twice longer in pulse period than the system clock CLK1. On the other hand, the synchronous clock signal CLK2 has the pulse period as long as a half of the pulse period of the intermediate delayed clock signal CLK5, which is twice longer in pulse period than the system clock signal CLK1. For this reason, the synchronous clock signal CLK2 is as long in pulse period as the system clock CLK1. The synchronous latch circuits 13n latches the dummy data signal DY1 in response to the synchronous clock signal CLK2, and the dummy output signal Sn is alternated between the high level and the low level in response to the system clock signal CLK1.

The dummy output signal Sn returns to the phase comparator 12a. With the dummy output signal Sn, the phase-locked loop 12 carries out the self-regulation at every pulse of the intermediate delayed clock signal CLK5. If the dummy data signal DY1 is equal in frequency to the synchronous clock signal CLK2, the synchronous latch circuit 13n continuously outputs the high level at the output node thereof, and the phase-locked loop 12 can not carry out the self-regulation. Thus, when the phase-locked loop 12 achieves the self-frequency regulation by using the dummy data signal DY1 (2×M) times longer in pulse period than the intermediate clock signal CLK3, the data buffer 9n periodically alternates the high level with the low level. The dummy capacitive load Ln is adjusted to the capacitive load La/ Lb/ . . . / Ln−1 to be driven by the data buffer 9a/ 9b/ . . . / 9n−1, and the dummy output signal Sn is expected to drive the dummy capacitive load Ln. The dummy output signal Sn has the pulse rise time and the pulse decay time depending upon the capacitive load Ln. Even though the pulse rise time and the pulse decay time are varied together with the capacitive load Ln, the phase-locked loop 12 regulates the pulse rise of the synchronous clock signal CLK2 to an appropriate timing, and makes the leading edge of the dummy output signal Sn aligned with the leading edge of the intermediate delayed clock signal CLK5. Thus, the timing regulator 6 according to the present invention automatically introduces the predetermined time delay between the pulse rise of the system clock 6 and the output timing for the output signals Sa to Sn−1. For this reason, the manufacturer does not need to check the products to see whether or not the delay time falls within a narrow time period defined in the specification. This results in reduction of the production cost.

In this instance, the phase-locked loop 10 and the delay circuit 11 as a whole constitute a delayed signal generator, and the phase-locked loop 12, the synchronous latch circuits 13a to 13n and the data buffer 9n form in combination an output timing generator.

Second Embodiment

Figure 7:
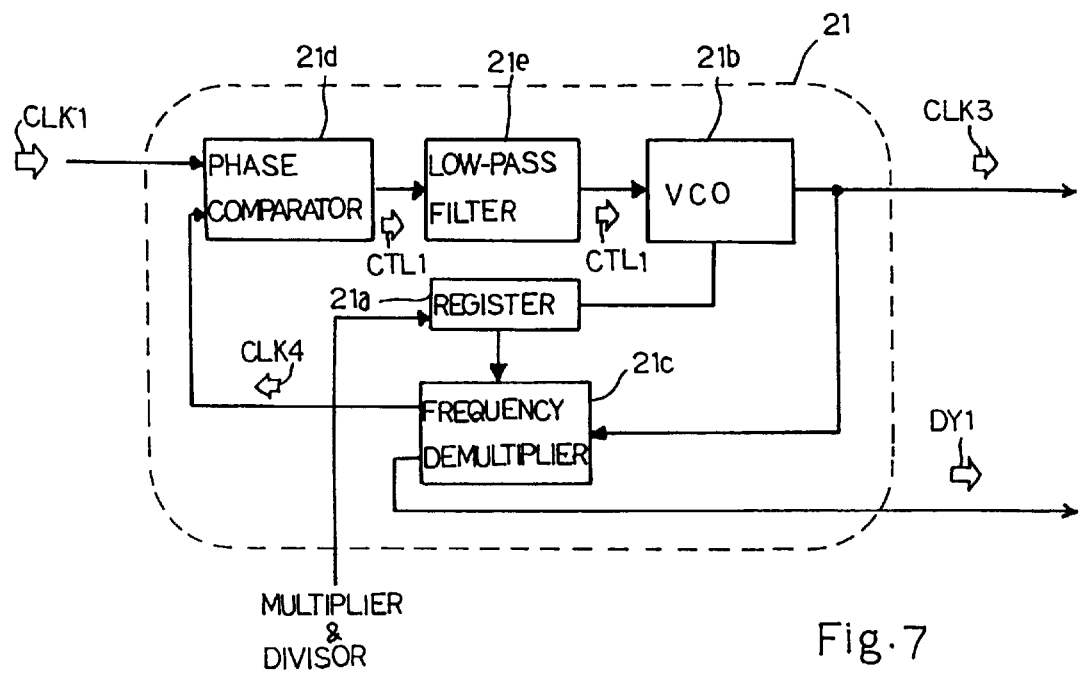
FIG. 7 is a block diagram showing the circuit configuration of a phase-locked loop incorporated in another timing regulator according to the present invention.

FIG. 7 illustrates a phase-locked loop 21 incorporated in another timing regulator embodying the present invention. Although the timing regulator implementing the second embodiment also includes the delay circuit 11, the phase-locked loop 12, the synchronous latch circuits 13a–13n, the data buffer 9n and the dummy load Ln, they are omitted from FIG. 7 for the sake of simplicity.

The phase-locked loop 21 is corresponding to the phase-locked loop 10, and includes a register 21a, a voltage-controlled oscillator 21c and a frequency demultiplier 21c. A phase comparator 21d and a low-pass filter 21e are similar to those of the phase-locked loop 10, and the phase comparator 21d, the low-pass filter 21e, the voltage-controlled oscillator 21b and the frequency demultiplier 21c form a control loop. The phase-locked loop 21 produces the intermediate clock signals CLK3/ CLK4 and the dummy data signal DY1 as similar to the phase-locked loop 10. The difference from the phase-locked loop 10 is the register 21a. The resistor 21a stores a multiplier for the voltage-controlled oscillator 21b and a divisor for the frequency demultiplier 21c, and the multiplier and the divisor stored in the register 21a are rewritable. For this reason, the manufacturer or a user can change the frequency of the intermediate clock signal CLK3, the frequency of the intermediate clock signal CLK4 and the dummy data signal DY1.

Third Embodiment

Figure 8:
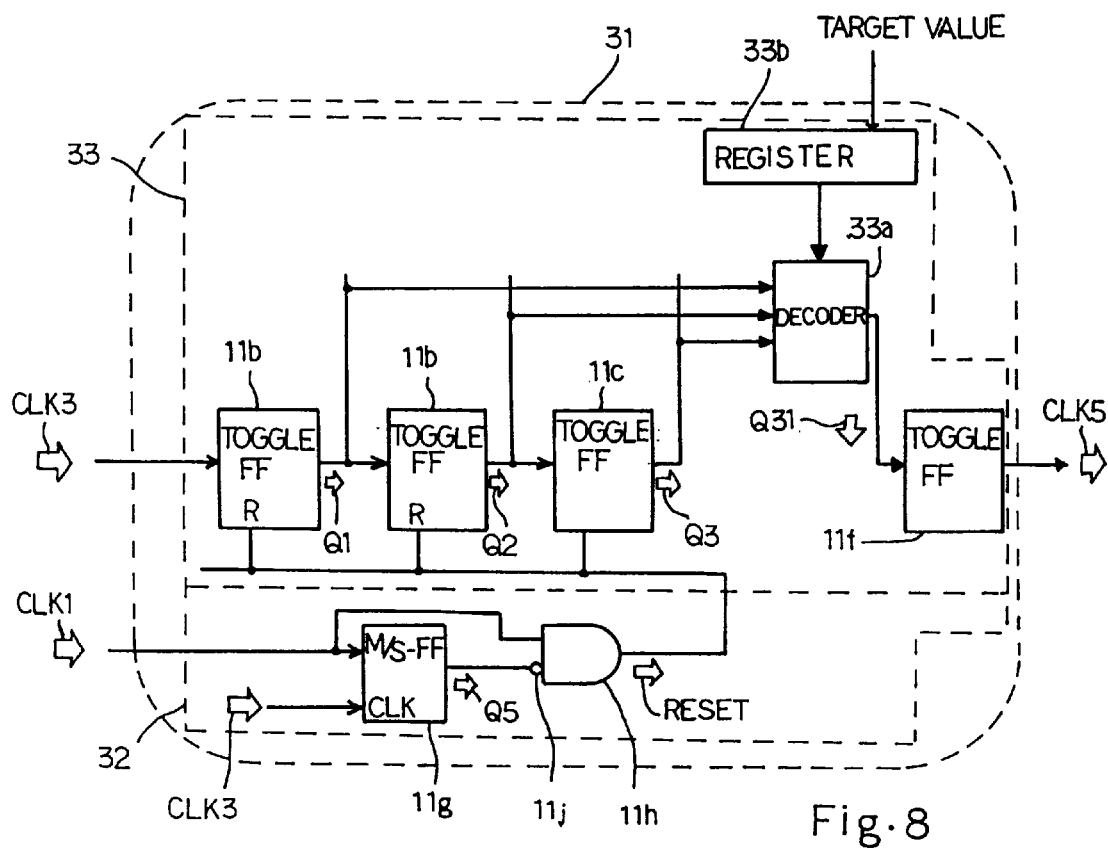
FIG. 8 is a block diagram showing the circuit configuration of a delay circuit incorporated in yet another timing regulator according to the present invention.

FIG. 8 illustrates a delay circuit 31 incorporated in yet another timing generator embodying the present invention. The timing regulator implementing the third embodiment also includes the phase-locked loop 10/21, the phase-locked loop 12, the synchronous latch circuits 13a–13n, the data buffer 9n and the dummy load Ln. However, they are omitted from FIG. 8 for the sake of simplicity.

The delay circuit 31 is also broken down into a reset signal generator 32 and a counter 33. The reset signal generator 32 is similar in circuit configuration to the reset signal generator 11m, and, accordingly, the circuit components are labeled with the same references designating corresponding circuit components of the reset signal generator 11m without detailed description.

The AND gate 11d and the inverter 11e are replaced with a decoder 33a, and a register is added. The other circuit components are similar to those of the counter 11k, and are labeled with the same references designating the corresponding circuit components of the counter 11k.

The output signals Q1/Q2/Q3 are supplied to the decoder 33a, and the register 33b supplies a target value to the decoder 33a. The decoder compares the value represented by the output signals Q1/Q2/Q3 with the target value, and supplies a hit signal Q31 to the toggle flip-flop circuit 11f. The manufacturer or a user can rewrite the target value in the register 33b so as to change the delay time between the pulse rise of the system clock signal CLK1 and the pulse rise and the pulse decay of the intermediate delayed clock signal CLK5.

As will be appreciated from the foregoing description, the delayed signal generator, i.e., the combination of the phase-locked loop 10/21 and the delay circuit 11/31 generates the intermediate delayed clock signal CLK5 with the predetermined delay time regardless of electric characteristics of the circuit components and the environment, and the output timing generator, i.e., the combination of the phase-locked loop 12, the synchronous latch circuits 13a–13n and the data buffer 9n offers the output timing delayed from the system clock signal by the predetermined delay time for the output signals Sa–Sn−1. Even if the load to be driven is different, the output timing generator keeps the output timing constant. This means that the manufacturer does not need to carry out the test to see whether or not the output timing falls without a narrow range defined in the design specification. Any tester is required. For this reason, the manufacturer reduces the production cost of the semiconductor integrated circuit device.

Moreover, even if the output timing is deviated from a target range, the manufacturer or a user can change the output timing to the target range by changing the dummy load Ln. Thus, the timing regulator according to the present invention makes the defective product a few.

Although particular embodiments of the present invention have been shown and described, it will be apparent to those skilled in the art that various changes and modifications may be made without departing from the spirit and scope of the present invention.

For example, only the timing regulator according to the present invention may be integrated on a semiconductor chip.

The counter 11k incorporated in the timing regulator 6 is never limited to the circuit configuration shown in FIG. 3. The combination of the inverter 11e and the AND gate 11d is appropriate to the output signals Q3/Q2/Q1 of (110). However, the count value is never limited to (110). For example, if the output signals Q1/Q2 are supplied through inverters to the input nodes of the AND gate 11d, the AND gate 11d changes the output signal Q4 to the high level between time t4 and time t5 and between time t12 and time t13 on the basis of the output signals Q3/Q2/Q1=(100), and the intermediate delayed clock signal CLK5 changes the potential level at time t4 and time t12. Thus, the predetermined delay time is variable by selectively connecting the inverter or inverters to the input nodes of the AND gate 11d.

Various kinds of bi-stable circuit are available for the counter.

In the embodiments, the signal pad 3n is exclusively assigned to the timing regulator 6. However, a signal pad may be shared between the timing regulator 6 and another circuit such as, for example, a test circuit.

The phase-locked loop 10 and the delay circuit 11 of the timing regulator 6 may be replaced with the phase-locked loop 21 and the delay circuit 31, respectively.

What is claimed is:

1. A semiconductor integrated circuit device comprising a timing regulator for offering an output timing to output signals, said timing regulator including:
 a delayed signal generator supplied with a reference clock signal and producing a delayed clock signal having twice the period of the reference clock signal and delayed from said reference clock signal by a predetermined time, and
 an output timing generator connected to said delayed signal generator and compensating a time lag between said delayed clock signal and said output signals for outputting said output signals at said output timing;
 said predetermined time controlled by a stored binary value input by a user and being an arbitrary value other than zero.

2. The semiconductor integrated circuit device as set forth in claim 1, in which said delayed signal generator further produces a dummy data signal supplied to said output timing generator, and said output timing generator further outputs a dummy output signal at said output timing for driving a dummy load corresponding to each load driven by one of said output signals.

3. The semiconductor integrated circuit device as set forth in claim 2, in which said delayed signal generator includes
 a first phase-locked loop supplied with said reference clock signal and producing a first intermediate clock signal having a first frequency equal to a first multiple of the frequency of said reference clock signal, a second intermediate clock signal compared with said reference clock signal for decreasing a phase difference therebetween and having a second frequency equal to the quotient of a division where said first frequency is divided by said first multiple and said dummy data signal having a third frequency equal to a half of said second frequency, and
 a delay circuit supplied with said first intermediate clock signal and said reference clock signal and producing said delayed clock signal having pulse edges each delayed from either pulse edge of said reference clock signal by said predetermined time equal to a second multiple of a pulse period of said first intermediate clock signal, and
 said output timing generator includes
 a second phase-locked loop supplied with said delayed clock signal and said dummy output signal for decreasing a phase difference therebetween and producing a synchronous clock signal delayed from said reference clock signal, and
 plural synchronous data storing circuits responsive to said synchronous clock signal for storing a first data represented by said output signals and a second data represented by said dummy data signal, thereby outputting said output signals and said dummy data signal at said output timing.

4. The semiconductor integrated circuit device as set forth in claim 3, in which said first phase-locked loop includes
 a phase comparator having input nodes supplied with said reference clock signal and said second intermediate clock signal for producing a control voltage signal representative of the phase difference between said reference clock signal and said second intermediate clock signal,
 a low-pass filter supplied with said control voltage signal for eliminating high-frequency noise from said control voltage signal,
 a voltage controlled oscillator supplied with said control voltage signal from said low-pass filter and responsive to the magnitude of said control voltage signal for producing said first intermediate clock signal, and
 a frequency demultiplier supplied with said first intermediate clock signal for producing said second intermediate clock signal and said dummy data signal.

5. The semiconductor integrated circuit device as set forth in claim 4, in which said first phase-locked loop further includes a register storing said first multiple in a rewritable manner and connected to said voltage-controlled oscillator and said frequency demultiplier for supplying said first multiple thereto.

6. The semiconductor integrated circuit device as set forth in claim 3, in which said delay circuit includes
 a reset signal generator supplied with said reference clock signal and said first intermediate clock signal for periodically producing a reset signal concurrently with said either pulse edge of said reference clock signal, and
 a counter reset with said reset signal, responsive to said first intermediate clock signal for changing a value stored therein and producing said delayed clock signal when said value reaches said second multiple.

7. The semiconductor integrated circuit device as set forth in claim 6, in which said counter includes
 first bi-stable circuits connected in series, having respective reset nodes supplied with said reset signal and responsive to said first intermediate clock signal for producing respective digit signals representative of said value, and
 a logic circuit supplied with said digit signals for producing said delayed clock signal.

8. The semiconductor integrated circuit device as set forth in claim 7, in which said logic circuit includes
 a logic gate having input nodes supplied with said digit signals for carrying out a predetermined logical operation,
 at least one inverter connected between an output node of one of said bi-stable circuits and one of said input nodes of said logic gate, and
 a second bi-stable circuit connected to an output node of said logic gate for producing said delayed clock signal.

9. The semiconductor integrated circuit device as set forth in claim 8, in which said logic gate and said second bi-stable circuit comprises an AND gate and a toggle flip-flop circuit, respectively.

10. The semiconductor integrated circuit device as set forth in claim 7, in which each of said first bi-stable circuits comprises a toggle flip-flop circuit.

11. The semiconductor integrated circuit device as set forth in claim 6, in which said counter includes first bi-stable circuits connected in series, having respective reset nodes supplied with said reset signal and responsive to said first intermediate clock signal for producing respective digit signals representative of said value, and a comparing circuit connected to said first bi-stable circuits and comparing said value with a target value for producing said delayed clock signal.

12. The semiconductor integrated circuit device as set forth in claim 11, in which said comparing circuit includes a source of target value for storing said target value, a decoder having a first input port supplied with said digit signals, a second input port supplied with said target value and an output port for producing a hit signal when said value is equal to said target value, and a second bi-stable circuit responsive to said hit signal for producing said delayed clock signal.

13. The semiconductor integrated circuit device as set forth in claim 12, in which said source of target value comprises a register for storing said target value in a rewritable manner.

14. The semiconductor integrated circuit device as set forth in claim 12, in which said second bi-stable circuit comprises a toggle flip-flop circuit.

15. The semiconductor integrated circuit device as set forth in claim 3, in which said second phase-locked loop includes a phase comparator supplied with said delayed clock signal and said dummy output signal for producing a control voltage signal representative of the phase difference between said delayed clock signal and said dummy output signal, a low-pass filter connected to said phase comparator for eliminating high-frequency noise from said control voltage signal, and a voltage controlled oscillator connected to said low-pass filter and responsive to the magnitude of said control voltage signal for producing said synchronous clock signal.

16. The semiconductor integrated circuit device as set forth in claim 3, in which each of said plural synchronous data storing circuits includes a synchronous latch circuit having an input node supplied with one of said output signals or said dummy data signal, a clock node supplied with said synchronous clock signal and an output node for outputting one of said output signals or said dummy output signal.

17. The semiconductor integrated circuit device as set forth in claim 1, in which said delayed signal generator includes a first phase-locked loop supplied with said reference clock signal and producing a first intermediate clock signal having a first frequency equal to a first multiple of the frequency of said reference clock signal and a second intermediate clock signal compared with said reference clock signal for decreasing a phase difference therebetween and having a second frequency equal to the quotient of a division where said first frequency is divided by said first multiple, and a delay circuit supplied with said first intermediate clock signal and said reference signal and producing said delayed clock signal having pulse edges each delayed from either pulse edge of said reference clock signal by said predetermined time equal to a second multiple of a pulse period of said first intermediate clock signal.

18. The semiconductor integrated circuit device as set forth in claim 17, in which one of said output signals and said delayed clock signal are supplied to a second phase-locked loop forming a part of said output timing generator for producing a synchronous clock signal having a third frequency equal to the frequency of said reference clock signal and pulse edges delayed from the pulse edges of said reference clock signal, and said output timing generator further includes plural synchronous data storing circuits responsive to said synchronous clock signal for storing data respectively represented by said output signals in a rewritable manner.

* * * * *